United States Patent
Morooka

(10) Patent No.: US 7,564,713 B2
(45) Date of Patent: Jul. 21, 2009

(54) SEMICONDUCTOR INTEGRATED CIRCUIT DEVICE WHEREIN DURING DATA WRITE A POTENTIAL TRANSFERRED TO EACH BIT LINE IS CHANGED IN ACCORDANCE WITH PROGRAM ORDER OF PROGRAM DATA

(75) Inventor: Midori Morooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 11/411,940

(22) Filed: Apr. 27, 2006

(65) Prior Publication Data

US 2006/0245261 A1 Nov. 2, 2006

(30) Foreign Application Priority Data

Apr. 28, 2005 (JP) ............... 2005-133633

(51) Int. Cl.
*G11C 16/04* (2006.01)
(52) U.S. Cl. .............. 365/185.12; 365/185.03; 365/185.17; 365/185.28
(58) Field of Classification Search ............ 365/185.03, 365/185.08, 185.12, 185.17, 185.21, 185.28
See application file for complete search history.

(56) References Cited

U.S. PATENT DOCUMENTS

| | | | |
|---|---|---|---|
| 5,570,315 A | 10/1996 | Tanaka et al. | |
| 5,652,719 A | 7/1997 | Tanaka et al. | |
| 5,847,992 A | 12/1998 | Tanaka et al. | |
| 6,643,188 B2 | 11/2003 | Tanaka et al. | |
| 6,807,096 B2 * | 10/2004 | Toda | 365/185.03 |
| 6,885,583 B2 * | 4/2005 | Tanaka | 365/185.08 |
| 7,092,290 B2 * | 8/2006 | Hemink | 365/185.18 |
| 7,173,859 B2 * | 2/2007 | Hemink | 365/185.28 |
| 7,196,946 B2 * | 3/2007 | Chen et al. | 365/189.07 |
| 7,206,230 B2 * | 4/2007 | Li et al. | 365/185.22 |

FOREIGN PATENT DOCUMENTS

| | | |
|---|---|---|
| JP | 2001-243782 | 9/2001 |
| JP | 2003-157686 | 5/2003 |
| JP | 2003-196988 | 7/2003 |

* cited by examiner

*Primary Examiner*—Hoai V Ho
(74) *Attorney, Agent, or Firm*—Oblon, Spivak, McClelland, Maier & Neustadt, P.C.

(57) ABSTRACT

The present invention discloses a semiconductor integrated circuit device having nonvolatile semiconductor memory cells, bit lines each connected to one end of the nonvolatile semiconductor memory cells, and a data circuit connected to the bit lines to temporarily store program data for the nonvolatile semiconductor memory cells. During a data write operation, the data circuit changes a potential transferred to each bit line in accordance with a program order of the program data.

8 Claims, 19 Drawing Sheets

FIG. 7A

| Data in memory cells after write operation | "11" | "01" | "10" | "00" |
|---|---|---|---|---|
| DS2 | – | – | – | – |
| DS3 | – | – | – | – |
| DS4 | 0 | – | 1 | – |

← Load external data

Load external data

FIG. 7B

| Data in memory cells after write operation | "11" | "01" | "10" | "00" |
|---|---|---|---|---|
| DS2 | – | – | – | – |
| DS3 | 0 | – | 1 | – |
| DS4 | 0 | – | 1 | – |

← Copied from DS4

Copy data in DS4 to DS3

FIG. 7C

| Data in memory cells after write operation | "11" | "01" | "10" | "00" |
|---|---|---|---|---|
| DS2 | 0 | – | 1 | – |
| DS3 | 0 | – | 1 | – |
| DS4 | 0 | – | 1 | – |

← Copied from DS3

Copy data in DS3 to DS2

FIG. 7D

| Data in memory cells after write operation | "11" | "01" | "10" | "00" |
|---|---|---|---|---|
| DS2 | 0 | – | 1 | – |
| DS3 | 0 | – | 1 | – |
| DS4 | 1 | – | 0 | – |

← Copied from DS2 after inversion

Invert data in DS2 and then copy to DS4

Programming of logically lower page (data cache set)

FIG. 8A

| Data in memory cells after write operation | "11" | "01" | "10" | "00" |
|---|---|---|---|---|
| DS2 | 0 | – | 1 | – |
| DS3 | 0 | – | 1 | – |
| DS4 | 1 | – | 0 | – |

Copied from DS3

Copy data in DS3 to DS2

FIG. 8B

| Data in memory cells after write operation | "11" | "01" | "10" | "00" |
|---|---|---|---|---|
| DS2 | 0 | – | 1 | – |
| DS3 | 1 | – | 0 | – |
| DS4 | 1 | – | 0 | – |

Copied from DS2 after inversion

Invert data in DS2 and then copy to DS3

FIG. 8C

| Data in memory cells after write operation | "11" | "01" | "10" | "00" |
|---|---|---|---|---|
| DS2 | 1 | – | 0 | – |
| DS3 | 1 | – | 0 | – |
| DS4 | 1 | – | 0 | – |

Copied from DS3

Copy data in DS3 to DS2

Programming of logically lower page (data cache set)

| Program state<br>Data state | "11" program<br>data "11" | "L0" program<br>(1ST Pass) | "L0" program<br>(2ND Pass) | "L0" program<br>completion data "L0" |
|---|---|---|---|---|
| DS2 | 1 | 0 | Change → ①  | 1 |
| DS3 | 1 | 0 | 0 | Change → ① |
| DS4 | 1 | 0 | 0 | 0 |

Value resulting from data cache setting

Changes in data cache resulting from programming of logically lower page data

| Data in memory cells after write operation | "11" | "01" | "10" | "00" | |
|---|---|---|---|---|---|
| DS2 | – | – | – | – | Load internal data |
| DS3 | 0 | 0 | 1 | 1 | ← data |
| DS4 | 0 | 1 | 0 | 1 | ← Load external data |

Load internal and external data

FIG. 10B

| Data in memory cells after write operation | "11" | "01" | "10" | "00" | |
|---|---|---|---|---|---|
| DS2 | 0 | 0 | 1 | 1 | Copied from DS3 |
| DS3 | 0 | 0 | 1 | 1 | |
| DS4 | 0 | 1 | 0 | 1 | |

Copy data in DS3 to DS2

FIG. 10C

| Data in memory cells after write operation | "11" | "01" | "10" | "00" | |
|---|---|---|---|---|---|
| DS2 | 0 | 0 | 1 | 1 | |
| DS3 | 0 | 1 | 0 | 1 | Copied from DS4 |
| DS4 | 0 | 1 | 0 | 1 | |

Copy data in DS4 to DS3

FIG. 10D

| Data in memory cells after write operation | "11" | "01" | "10" | "00" | |
|---|---|---|---|---|---|
| DS2 | 0 | 0 | 1 | 1 | |
| DS3 | 0 | 1 | 0 | 1 | |
| DS4 | 1 | 1 | 0 | 0 | Copied from DS2 after inversion |

Invert data in DS2 and then copy to DS4

Programming of logically upper page (data cache set)

FIG. 11A

| Data in memory cells after write operation | "11" | "01" | "10" | "00" |
|---|---|---|---|---|
| DS2 | 0 | 1 | 0 | 1 |
| DS3 | 0 | 1 | 0 | 1 |
| DS4 | 1 | 1 | 0 | 0 |

Copied from DS3

Copy data in DS3 to DS2

FIG. 11B

| Data in memory cells after write operation | "11" | "01" | "10" | "00" |
|---|---|---|---|---|
| DS2 | 0 | 1 | 0 | 1 |
| DS3 | 1 | 0 | 1 | 0 |
| DS4 | 1 | 1 | 0 | 0 |

Copied from DS2 after inversion

Invert data in DS2 and then copy to DS3

FIG. 11C

| Data in memory cells after write operation | "11" | "01" | "10" | "00" |
|---|---|---|---|---|
| DS2 | 1 | 0 | 1 | 0 |
| DS3 | 1 | 0 | 1 | 0 |
| DS4 | 1 | 1 | 0 | 0 |

Copied from DS3

Copy data in DS3 to DS2

FIG. 11D

| Data in memory cells after write operation | "11" | "01" | "10" | "00" |
|---|---|---|---|---|
| DS2 | 1 | 0 | 1 | 0 |
| DS3 | 1 | 0 | 0 | 0 |
| DS4 | 1 | 1 | 0 | 0 |

Indicates logically lower page

Store synthesized logic from DS2 and DS4

Indicates logically upper page

Synthesize data from DS2 and DS4 and store resulting data in DS3

Programming of logically upper page (data cache set)

FIG. 12A

| Program state<br>Data state | Non-programmed<br>data "11" | "01" program<br>(1ST Pass) | "01" program<br>(2ND Pass) | "01" program<br>completion data "01" |
|---|---|---|---|---|
| DS2 | 1 | 0 | Change → ① | 1 |
| DS3 | 1 | 0 | 0 | Change → ① |
| DS4 | 1 | 1 | 1 | 1 |

Value resulting from data cache setting
Changes in data cache resulting from programming of the logically upper page data

FIG. 12B

| Program state<br>Data state | "10" program<br>data "L0" | "10" program<br>completion data "10" |
|---|---|---|
| DS2 | 1 | 1 |
| DS3 | 0 | Change → ① |
| DS4 | 0 | 0 |

Value resulting from data cache setting
Changes in data cache resulting from programming of the logically upper page data

FIG. 12C

| Program state<br>Data state | "00" program<br>(1st Pass) | "00" program<br>(2nd Pass) | "00" program<br>completion data "00" |
|---|---|---|---|
| DS2 | 0 | Change → ① | 1 |
| DS3 | 0 | 0 | Change → ① |
| DS4 | 0 | 0 | 0 |

Value resulting from data cache setting
Changes in data cache resulting from programming of the logically upper page data $\Delta Vpgm\ 1L = \Delta Vpgm\ 1U$ $\triangle Vpgm\ 1L > \triangle Vpgm\ 1U$

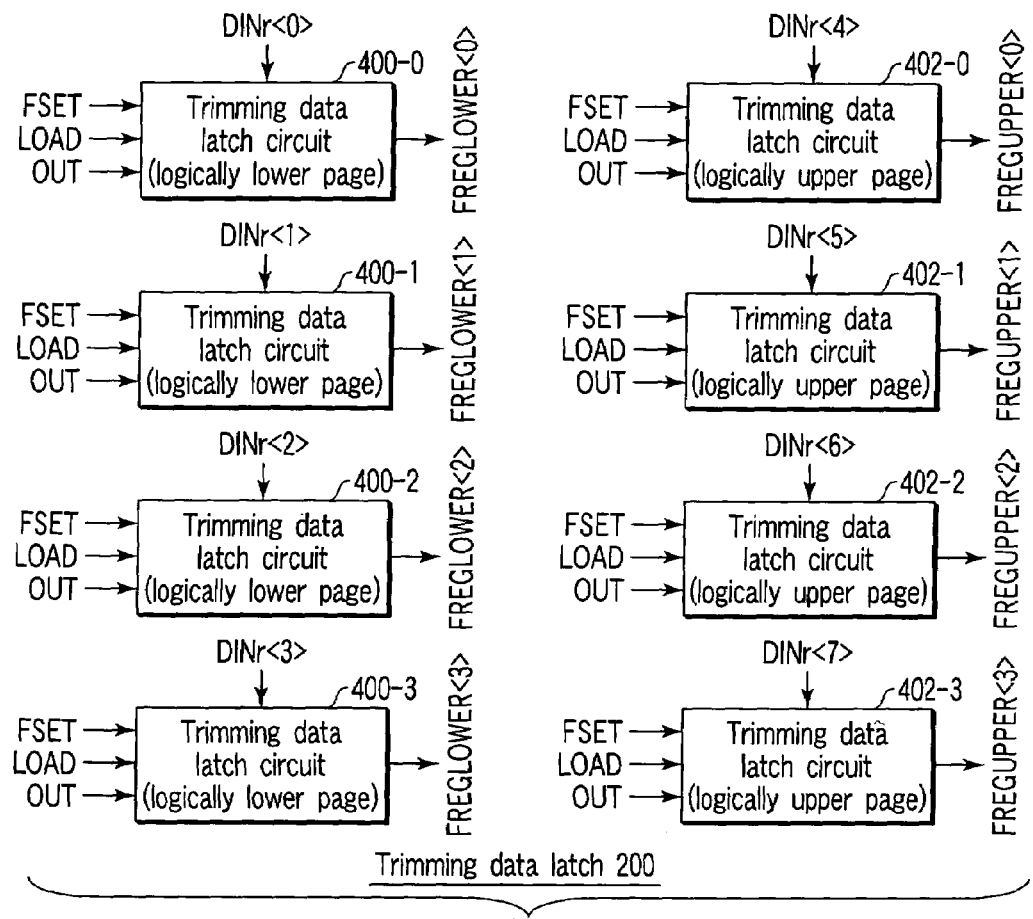
F I G. 19
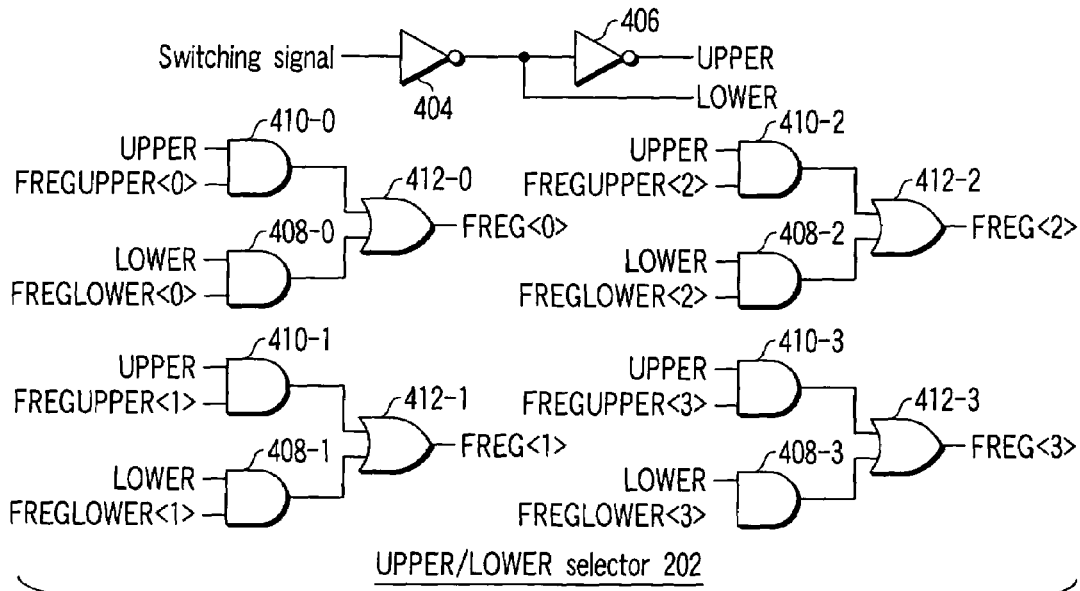
F I G. 20

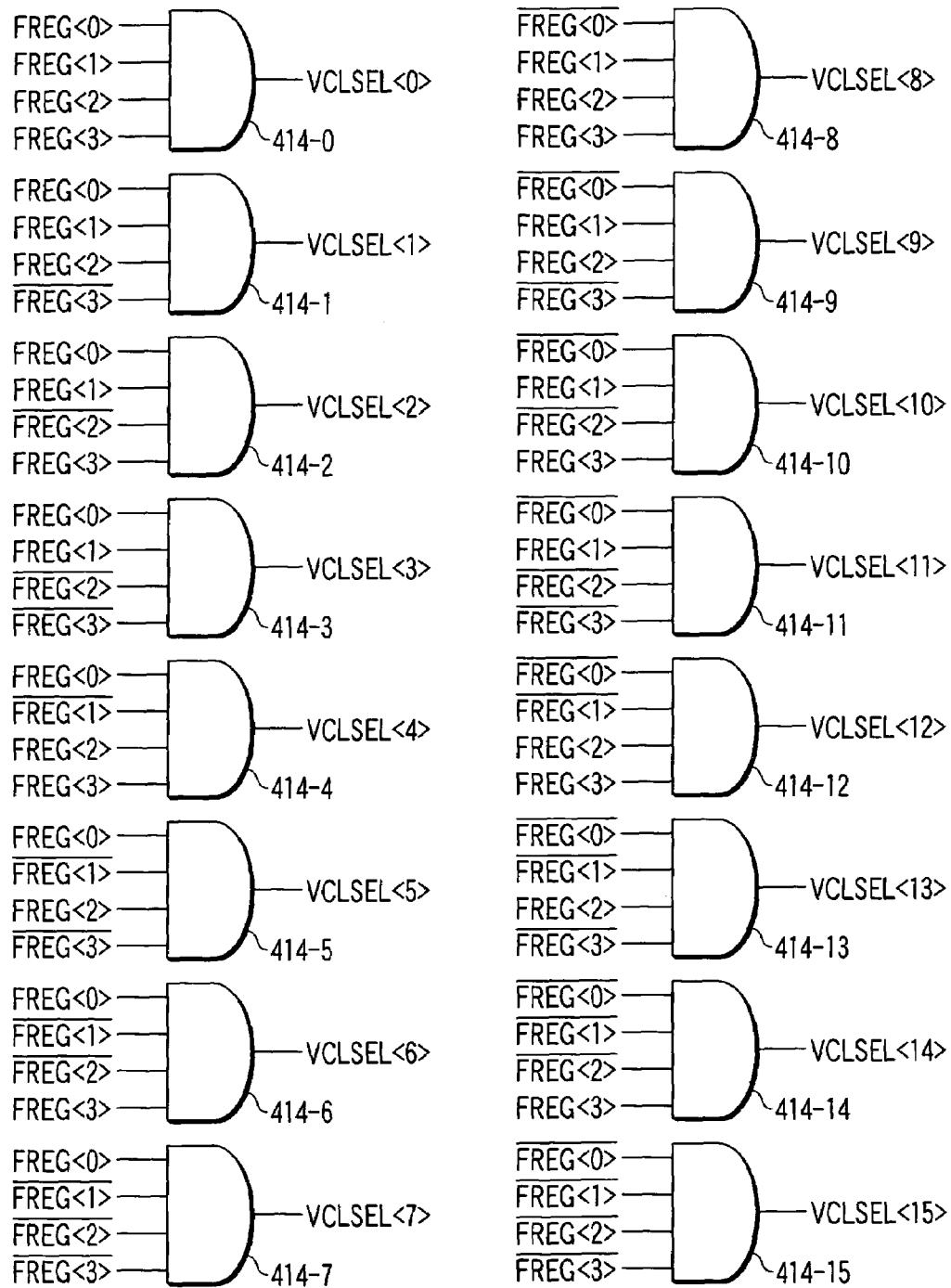
F I G. 21

Variable resistance circuit 300

SEMICONDUCTOR INTEGRATED CIRCUIT DEVICE WHEREIN DURING DATA WRITE A POTENTIAL TRANSFERRED TO EACH BIT LINE IS CHANGED IN ACCORDANCE WITH PROGRAM ORDER OF PROGRAM DATA

CROSS-REFERENCE TO RELATED APPLICATIONS

This application is based upon and claims the benefit of priority from prior Japanese Patent Application No. 2005-133633, filed Apr. 28, 2005, the entire contents of which are incorporated herein by reference.

BACKGROUND OF THE INVENTION

1. Field of the Invention

The present invention relates to a semiconductor integrated circuit device, and in particular, to a semiconductor integrated circuit device comprising an electrically rewritable nonvolatile semiconductor storage device.

2. Description of the Related Art

Electrically rewritable nonvolatile semiconductor storage devices, for example, multivalue flash memories require a reduction in the breadth of distribution of a write threshold voltage.

However, a decrease in the breadth of distribution of the write threshold voltage requires a reduction in the shift in the threshold voltage during a write operation. This may slow down the write operation.

Document 1: Jpn. Pat. Appln. KOKAI Publication No. 2003-196988 (corresponding U.S. patent: U.S. Pat. No. 6,643,188)

BRIEF SUMMARY OF THE INVENTION

A semiconductor integrated circuit device according to a first aspect of the present invention comprises nonvolatile semiconductor memory cells, bit lines each connected to one end of the nonvolatile semiconductor memory cells, and a data circuit connected to the bit lines to temporarily store program data for the nonvolatile semiconductor memory cells, the data circuit changing, during a data write operation, a potential transferred to each bit line in accordance with a program order of the program data.

A semiconductor integrated circuit device according to a second aspect of the present invention comprises nonvolatile semiconductor memory cells, bit lines each connected to one end of the nonvolatile semiconductor memory cells, and a data circuit connected to the bit lines to temporarily store program data for the nonvolatile semiconductor memory cells, the data circuit changing, during a data write operation, a potential transferred to each bit line in accordance with a write scheme for the program data.

A semiconductor integrated circuit device according to a third aspect of the present invention comprises nonvolatile semiconductor memory cells, bit lines each connected to one end of the nonvolatile semiconductor memory cells, a potential transfer circuit including a transistor having a current passage to provide a potential to the bit lines via the current passage, and a regulated potential generating circuit which generates a regulated potential provided to a gate terminal of the transistor in the potential transfer circuit, the regulated potential generating circuit including trimming data latches which latch trimming data, a first selector which selects one of the trimming data in accordance with a switching signal, an encoder which encodes the selected trimming data to output a first selection signal group, a second selector which selects an output potential in accordance with the first selection signal group, and a third selector which selects the output potential in accordance with a second selection signal group to output the output potential as the regulated potential.

BRIEF DESCRIPTION OF THE SEVERAL VIEWS OF THE DRAWING

FIGS. 7A to 7D are diagrams showing an example of state of a data cache set;

FIGS. 8A to 8C are diagrams showing an example of state of the data cache set;

FIG. 9 is a diagram showing an example of how the data cache is varied by programming of a logically lower page;

FIGS. 10A to 10D are diagrams showing an example of state of the data cache set;

FIGS. 11A to 11D are diagrams showing an example of state of the data cache set;

FIGS. 12A to 12C are diagrams showing an example of how the data cache is varied by programming of a logically upper page;

FIG. 19 is a circuit diagram showing an example of trimming data latching;

FIG. 20 is a circuit diagram showing an example of an UPPER/LOWER selector;

FIG. 21 is a circuit diagram showing an example of an encoder; and

DETAILED DESCRIPTION OF THE INVENTION

Figure 1:
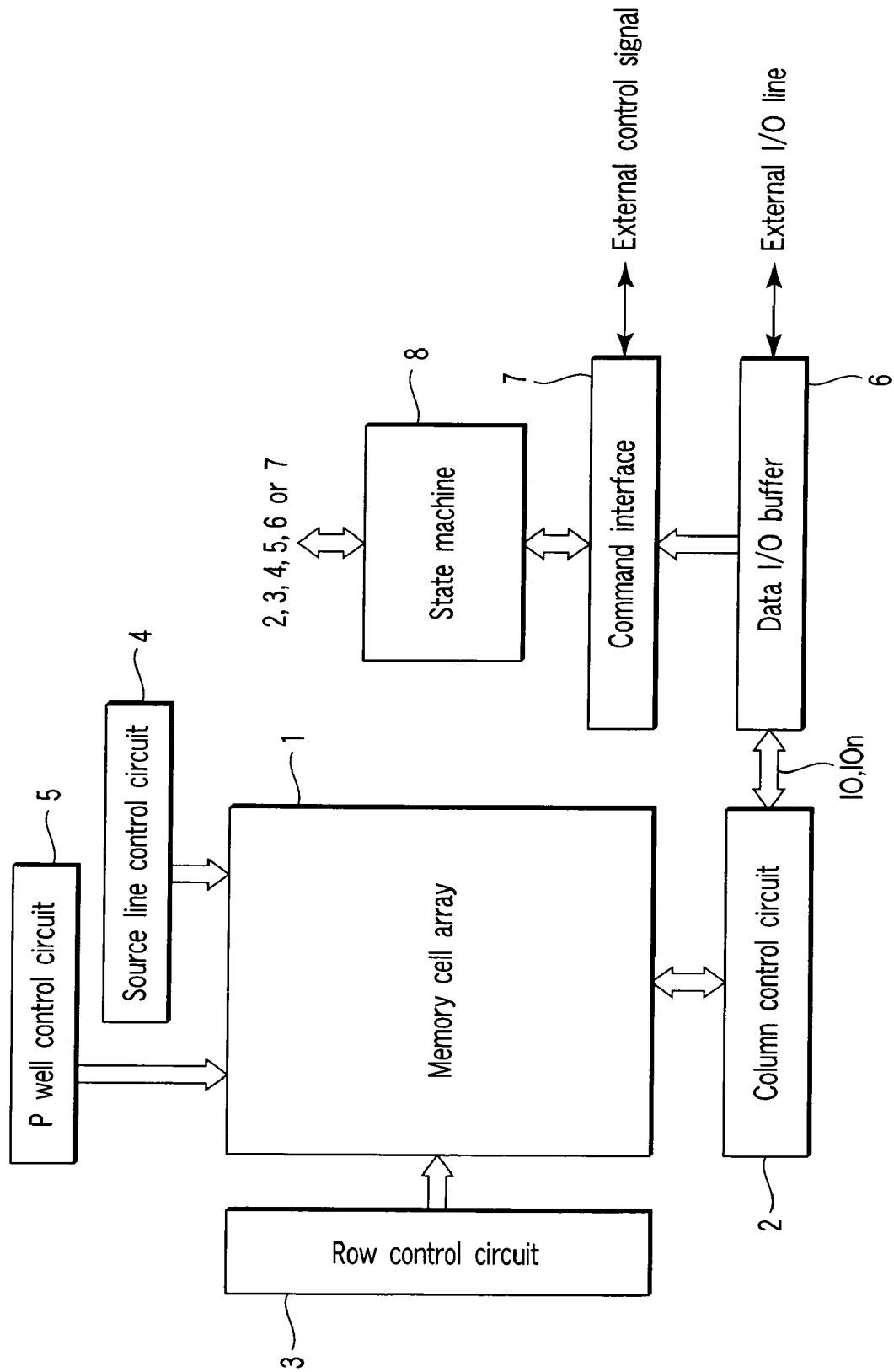
FIG. 1 is a block diagram showing an example of a semiconductor integrated circuit device in accordance with a first embodiment of the present invention.

Before describing embodiments of the present invention, description will be given of write schemes called pass write, quick pass write, and modified quick pass write.

The write scheme called pass write may be applied to a program operation requiring the precise control of a threshold voltage as in the case of a multivalue NAND type flash memory. The pass write is a technique of reducing the breadth of distribution of a write threshold by executing a first program called a $1^{ST}$ pass write and a second program called a $2^{ND}$ pass write (double write).

A modified example of the pass write is the write scheme called quick pass write. This write scheme reduces a write time by executing the $1^{ST}$ pass and the $2^{ND}$ pass in parallel.

A further improved example of the pass write is the write scheme called modified quick pass write. Similarly to the quick pass write, this write scheme executes the $1^{ST}$ pass and the $2^{ND}$ pass in parallel. The modified quick pass write further performs only one write operation for the $2^{ND}$ pass write to further control a threshold voltage precisely.

The present specification uses "QPW" as an abbreviation of the quick pass write and "MQPW" as an abbreviation of the modified quick pass write.

Several embodiments of the present invention will be described below with reference to the drawings. In the description, common parts are denoted by respective common reference numerals in all drawings.

First Embodiment

FIG. 1 is a block diagram showing an example of a semiconductor integrated circuit device in accordance with a first embodiment of the present invention. The first embodiment shows a NAND type flash memory as an example of the semiconductor integrated circuit device. However, the present invention is applicable to memories other than the NAND type flash memory.

In a memory cell array 1, nonvolatile semiconductor memory cells are arranged in a matrix. An example of the nonvolatile semiconductor memory cell is a flash memory cell.

A column control circuit 2 controls bit lines in the memory cell array 1 so that data can be deleted from, written to, or read from the memory cells. The column control circuit 2 is provided adjacent to the memory cell array 1.

A row control circuit 3 selects any of the word lines in the memory cell array 1 and applies a potential required for a delete, write, or read operation.

A source line control circuit 4 controls the source lines in the memory cell array 1.

A P well control circuit 5 controls the potential at a P-type cell well in which the memory cell array 1 is formed.

A data I/O buffer 6 is electrically connected to the column control circuit 2 via a pair of I/O lines IO and IOn. The data I/O buffer 6 is also electrically connected to an external host (not shown) via an external I/O line. For example, an I/O buffer circuit is placed in the data I/O buffer 6. The data I/O buffer 6 receives write data, outputs read data, and receives address data and command data. The data I/O buffer 6 sends received write data to the column control circuit 2 via the pair of I/O lines IO and IOn. The data I/O buffer 6 receives data read from the column control circuit 2, via the pair of I/O lines IO and IOn. The data I/O buffer 6 also sends address data externally input in order to select an address into the column control circuit 2, to the column control circuit 2 or the row control circuit 3 via a state machine 8. The data I/O buffer 6 also sends command data from an external host to a command interface 7.

The command interface 7 receives a control signal from the external host via an external control signal line to determine whether write, command, or address data has been input to the data I/O buffer 6. If command data has been input, the command interface 7 transfers it to the state machine 8.

The state machine 8 manages the entire flash memory. The state machine 8 receives command data from the external host to perform a read, write, or delete operation or the management of inputs and outputs of data.

Figure 2:
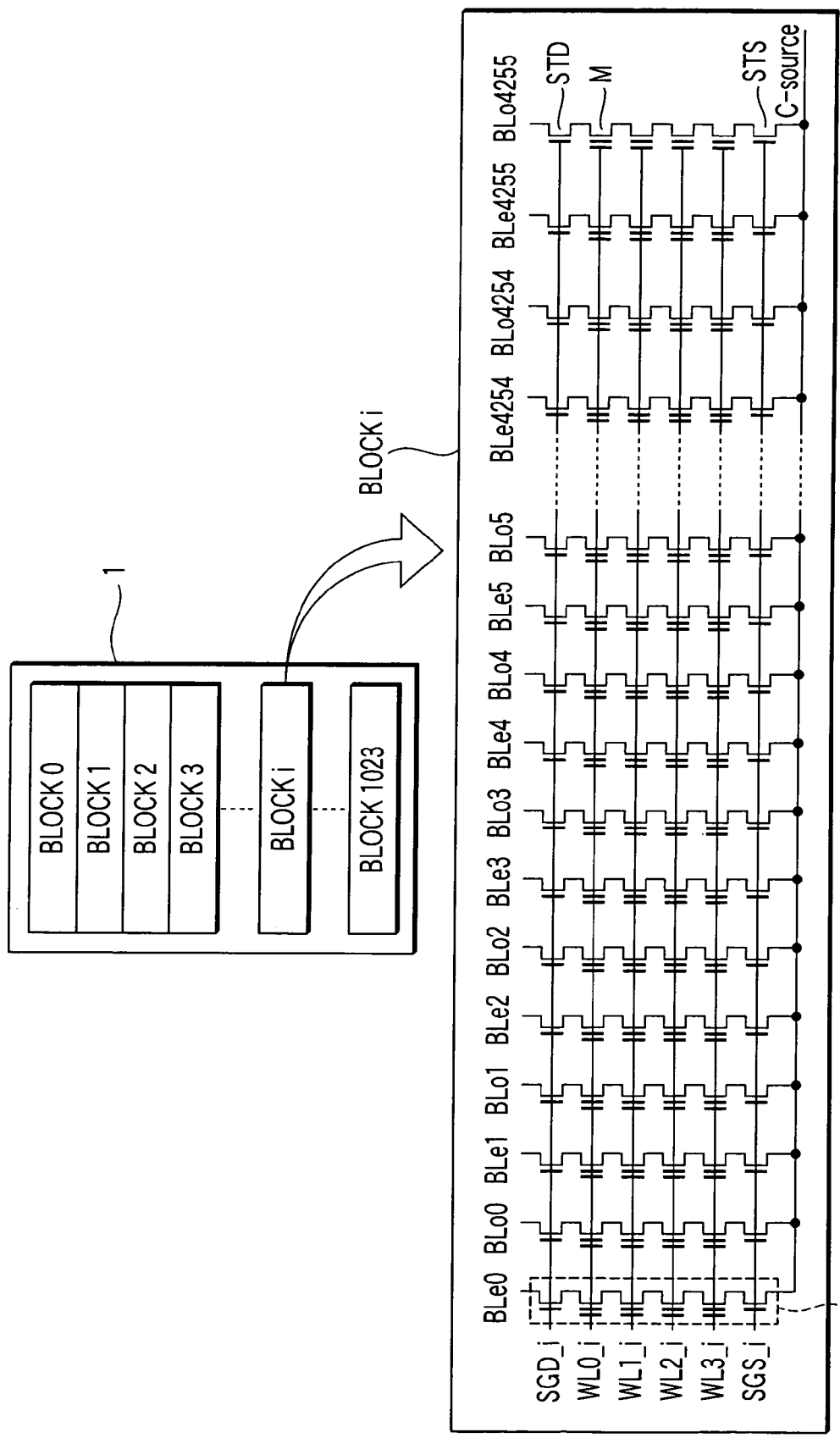
FIG. 2 is a diagram showing an example of a memory cell array 1 shown in FIG. 1.

FIG. 2 is a diagram showing an example of the memory cell array 1, shown in FIG. 1.

As shown in FIG. 2, the memory cell array 1 is divided into a plurality of, for example, 1,024 blocks BLOCK0 to BLOCK1023. The blocks are, for example, minimum units for an erase operation. Each block BLOCKi includes a plurality of, for example, 8,512 NAND type memory units. In this example, each NAND type memory unit includes two selection transistors STD and STS and a plurality (in the present example, four) of memory cells M connected together in series between the selection transistors STD and STS. One end of the NAND type memory unit is connected to a bit line BL via the selection transistor STD, connected to a selection gate line SGD. The other end of the NAND type memory unit is connected to a common source line C-source via the selection transistor STS, connected to a selection gate line SGS. Each memory cell M is connected to a word line W. A data write and read operations are performed independently on even-numbered bit lines BLe and on odd-numbered bit lines BLo; both the even and odd numbers start from zero. Data is simultaneously written or read from, for example, 4,256 of the 8,512 memory cells connected to one word line WL which are connected to bit lines BLe. A collection of data for 4,256 memory cells constitutes a unit called a page; each memory cell M stores 1-bit data. The page is, for example, a minimum unit for a read operation. If one memory cell M stores 2-bit data, 4,256 memory cells stores two pages of data. Similarly, the 4,256 memory cells connected to bit lines BLo constitute other two pages. Data is simultaneously written to or read from the memory cells within the page.

Figure 3:
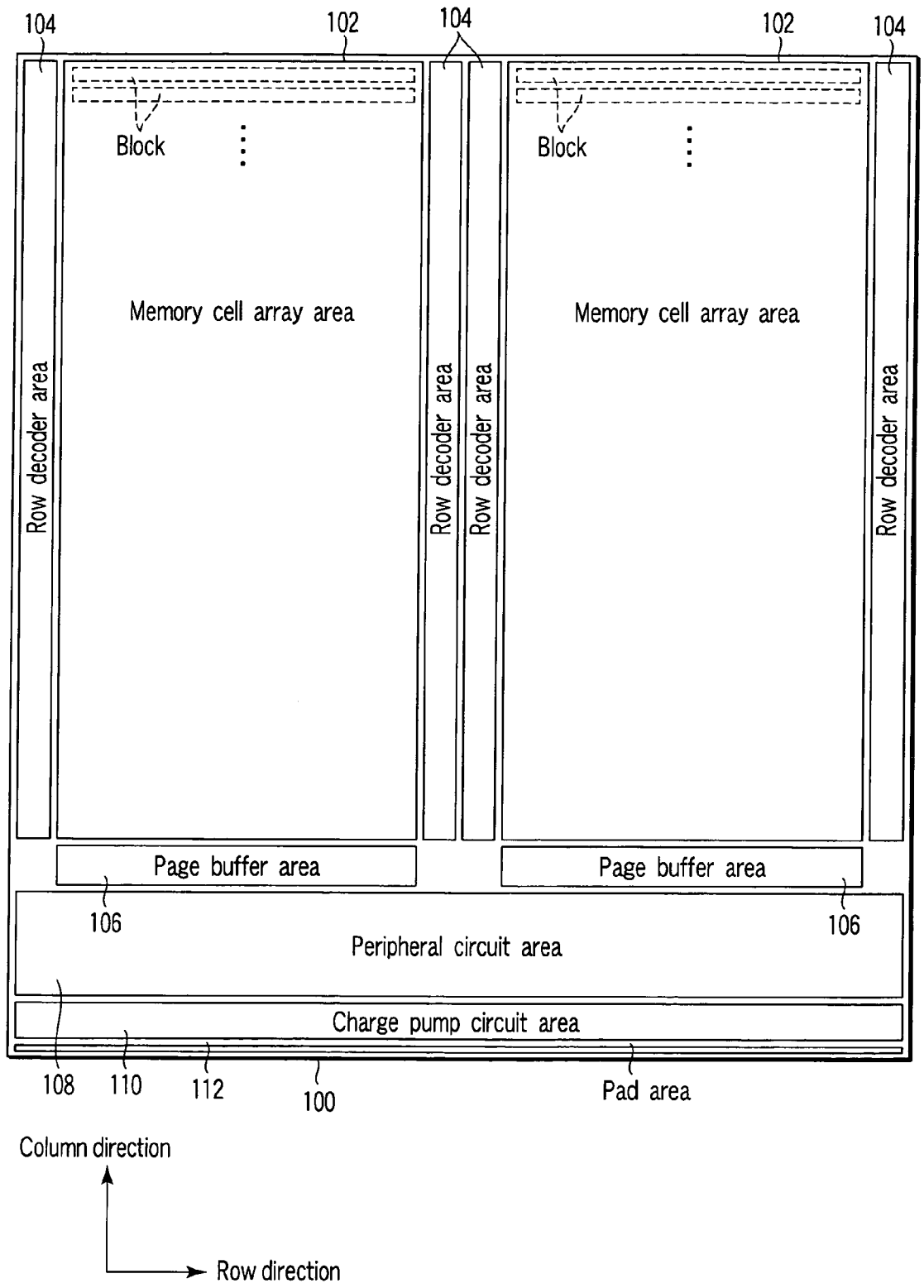
FIG. 3 is a plan view showing an example of a chip layout.

FIG. 3 is a plan view showing an example of a chip layout.

As shown in FIG. 3, a semiconductor chip 100 is provided with memory cell array areas 102, row decoder areas 104, page buffer areas 106, a peripheral circuit area 108, a charge pump circuit area 110, and a pad area 112.

The present example has the two memory cell array areas 102, in each of which memory cell arrays 1 are laid out.

The row decoder areas 104 are arranged at the opposite ends of each of the memory cell array areas 100 along the rows. Row control circuits 3 are laid out in each of the row decoder areas 104.

The page buffer areas 106, peripheral circuit area 108, charge pump circuit area 110, and pad area 112 are sequentially arranged at one end of the memory cell array 1 along the columns.

Column control circuits, for example, page buffers are laid out in each of the page buffer areas 106. The page buffer is a kind of data circuit that temporarily stores, for example, one page of write data to be written to the memory cell array 1 and, for example, one page of read data read from the memory cell array 1.

The column control circuit 2, data I/O buffer 6, command interface 7, and state machine 8 are laid out in the peripheral circuit area 108.

Charge pump circuits are laid out in the charge pump circuit 110. The charge pump circuit is a kind of booster circuit that generates power supply potentials required for write and erase operations, for example, a potential higher than an external power supply potential and an in-chip power supply potential used inside the chip.

The present example involves the single pad area 112, placed along one side of the chip. Pads are laid out in the pad area 112. The pad is a junction between the semiconductor chip 100 and an external apparatus. The pad is connected to, for example, the data I/O buffer 6 and command interface 7.

Now, description will be given of an example of operations of the semiconductor integrated circuit device in accordance with the first embodiment.

In the present example, the operations other than a write operation should be well-known. Accordingly, in the present specification, only the write operation will be described.

Figure 4:
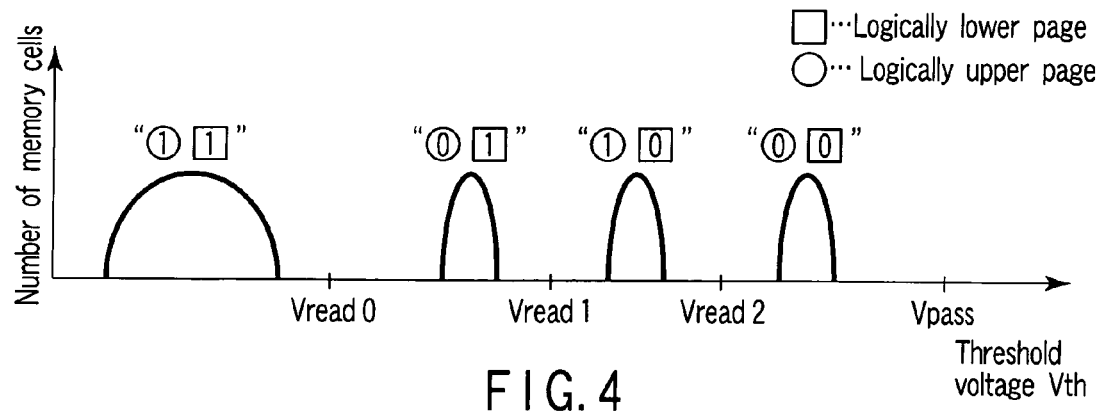
FIG. 4 is a diagram showing the distribution of a threshold voltage for memory cells in a four-value storage NAND type flash memory.

FIG. 4 is a diagram showing the distribution of a threshold voltage Vth for memory cells in a four-value NAND type flash memory.

As shown in FIG. 4, 2-bit data (four-value data) is stored in each memory cell. In the present example, the 2-bit data are defined as "11", "01", "10", and "00" in order of increasing threshold voltage Vth. The 2-bit data are stored in the same memory cell; one of the two bits is logically lower-page data (shown as □) and the other bit is logically upper page data (shown as ○).

"11" indicates an erase state. A memory cell in the erase state has a negative threshold voltage Vth.

"01", "10" and "00" each indicate a write state. A memory cell in the write state has a positive threshold voltage Vth.

The 2-bit data thus consists of logically lower and upper page data and is written to a memory cell through two write operations.

Description will be given of a write operation performed on a memory cell using the quick pass write.

Figure 5A:
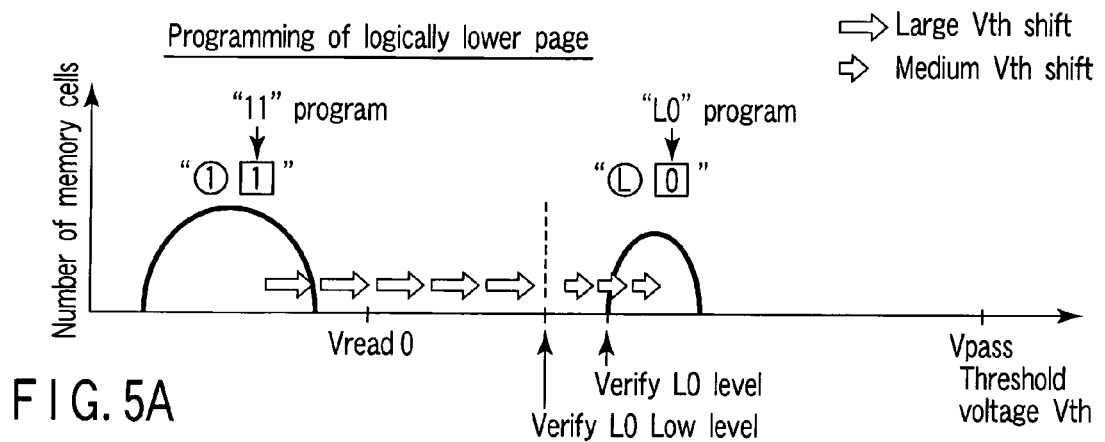
FIGS. 5A and 5B are diagrams showing a variation in the distribution of the threshold voltage.
Figure 5B:
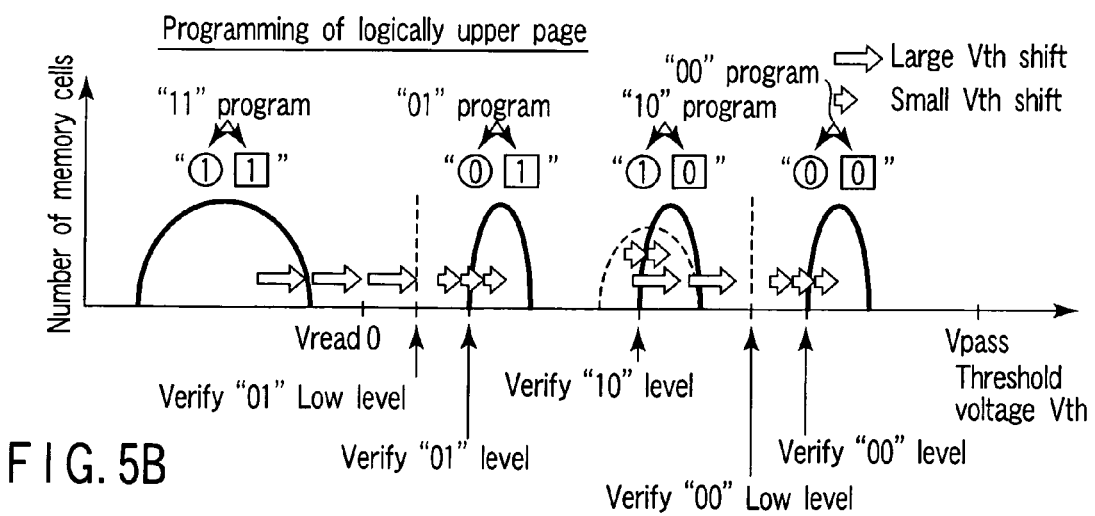

FIGS. 5A and 5B show a variation in the distribution of the threshold voltage Vth.

(Programming of Logically Lower Page Data)

It is assumed that all memory cells initially have a threshold voltage Vth in the erase state, that is, the "11" state. Subsequent programming of the logically lower page data divides the distribution of the threshold voltage Vth into two parts depending on whether the write data (logically lower page data) has a value of "1" or "0" (FIG. 5A).

(Programming of the Logically Lower Page Data "1")

If the logically lower page data (shown as □) is "1", the threshold voltage Vth of the memory cell is not shifted. By way of example, when a write potential is transferred to a word line, the potential across the corresponding bit line is made high (in-chip power supply potential Vdd, for example, 2.5V). This avoids applying high electric fields to a tunnel oxide film in the memory cell to suppress a rise in the threshold voltage Vth. As a result, the threshold voltage Vth of the memory cell maintains the erase state ("11" state).

(Programming of the Logically Lower Page Data "0")

If the logically lower page data is "0", the threshold voltage Vth is shifted. By way of example, when the write potential is transferred to the word line, a potential corresponding to one of the two program stages, the $1^{ST}$ and $2^{ND}$ passes, is transferred to the bit line.

($1^{ST}$ Pass)

For a memory cell having a threshold voltage Vth lower than "Verify L0 Low Level" shown in FIG. 2, that is, a memory cell on which the $1^{ST}$ pass is to be executed, the potential across the bit line is made low (in-chip ground potential Vdd, for example, 0V). This allows high electric fields to be applied to the tunnel oxide film to inject electrons into a floating gate electrode to raise the threshold voltage Vth.

($2^{ND}$ Pass)

For a memory cell having a threshold voltage Vth between "Verify L0 Low Level" and "Verify L0 Level" shown in FIG. 2, that is, a memory cell on which the $2^{ND}$ pass is to be executed, the potential across the bit line is set to a value (for example, 0.5V) larger than that set for the $1^{ST}$ pass. The tunnel oxide film is thus subjected to a smaller amount of electric field during the $2^{ND}$ pass than during the $1^{ST}$ pass. This results in a smaller rise in threshold voltage Vth during the $2^{ND}$ pass than during the $1^{ST}$ pass.

Thus, in a memory cell in which the logically lower page data "0" is to be programmed, the magnitude of a shift in the threshold voltage Vth per write operation remains large from the beginning of the erase state ("11" state), corresponding to an initial state, until "Verify L0 Low Level" is reached. Subsequently, the magnitude of a shift in threshold voltage Vth per write operation remains smaller until "Verify L0 Level" is exceeded.

The potential transferred to the bit line during programming of the logically lower page data is controlled by a data circuit (for example, a page buffer) connected to the bit line.

(Data Circuit)

Figure 6:
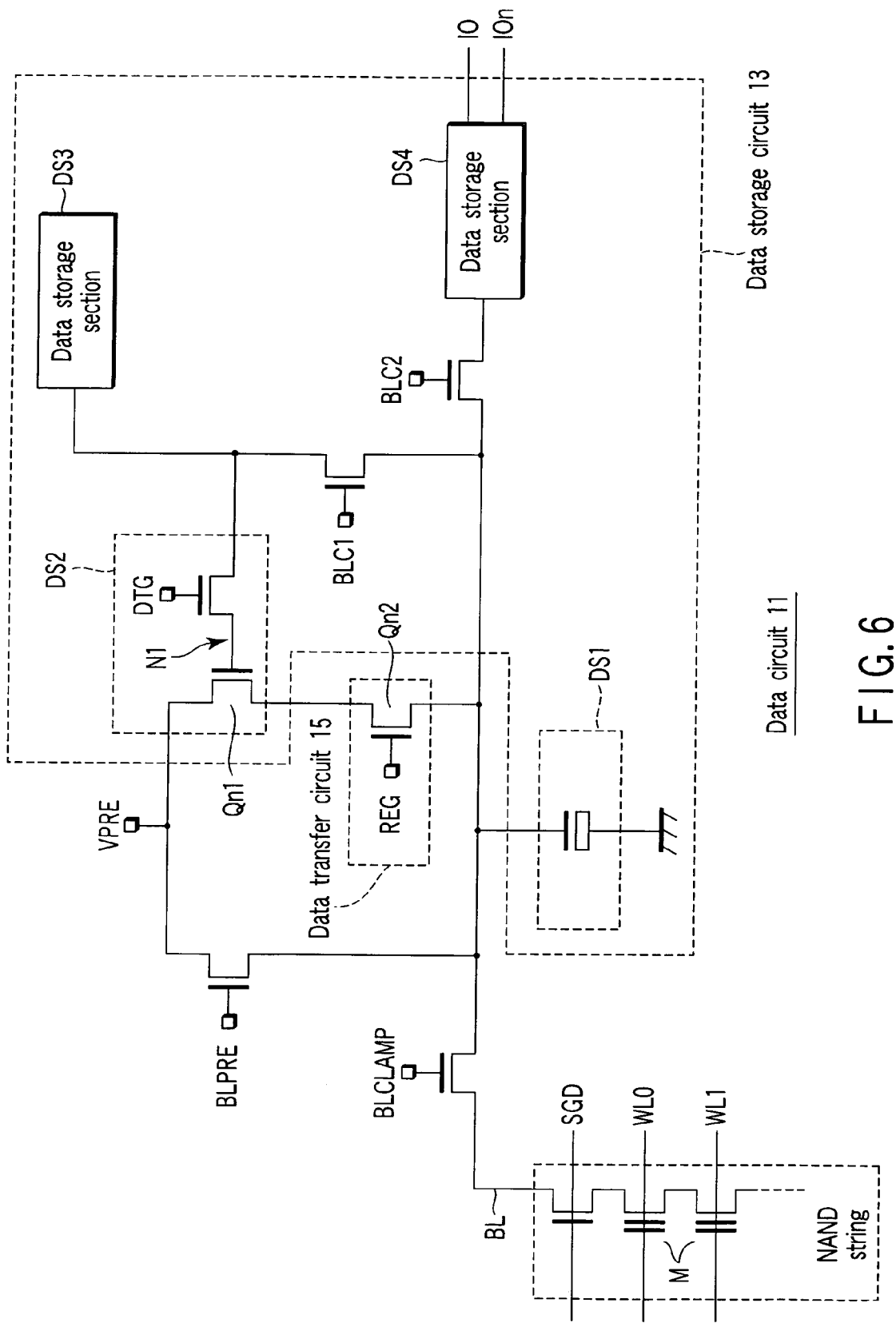
FIG. 6 is a circuit diagram showing an example of a data circuit.

FIG. 6 is a circuit diagram showing an example of a data circuit.

A data circuit 11 includes a data storage circuit 13 and a potential transfer circuit 15. The data storage circuit 13 in the present example includes data storage sections (data caches) DS1 to DS4.

Before a write operation, logically lower page data to be written is stored in the data storage section DS4 via the pair of I/O lines IO and IOn. In the present specification, this is called external data loading. After the external data loading, the data is stored in the storage sections DS2 to DS4; this operation is called data cache setting. Examples of these operations are shown in FIGS. 7A to 7D and 8A to 8C and their description is thus omitted. After the data cache setting, a write operation is started.

During the write operation, if the program has been completed, "1" is stored in the data storage section DS3. If the program has not been completed, "0" is stored in the data storage section DS3. That is, if the logically lower page data is "1", "1" is stored in the data storage section DS3. If the logically lower page data is "0", "1" or "0" is stored depending on verification of "Verify L0 Level"; for passage, "1" is stored, and for failure, "0" is stored.

If the $1^{ST}$ pass has been completed, "1" is stored in the data storage section DS2. If the $1^{ST}$ pass has not been completed, "0" is stored in the data storage section DS2. That is, if the logically lower page data is "1", the program itself has been completed, so that "1" is stored in DS2. If the logically lower page data is "0", "1" or "0" is stored depending on verification of "Verify L0 Low Level"; for passage, "1" is stored, and for failure, "0" is stored.

During programming of the logically lower page data, if the data "1" is stored in DS3, the potential Vdd is transferred from the data storage section DS3 to the bit line. If the data "0" is stored in DS3, the potential Vss is transferred from the data storage section DS3 to the bit line.

For QPW, a control signal VPRE is set to Vdd. If the data "1" is stored in the data storage section DS2, the potential at a gate of an N channel type MOS transistor Qn1 rises from about Vdd to about 5V owing to a bootstrap phenomenon. Thus, VPRE (=Vdd) is transferred to the bit line while being regulated by a regulation signal REG input to a gate of a potential transfer circuit (Qn2) only if the data "1" is stored in DS2.

Thus, if the data "1" is stored in DS3, Vdd is transferred to the bit line. Similarly, if the data "0" is stored in both DS3 and DS2, Vss is transferred. If the data "0" is stored in DS3, whereas the data "1" is stored in DS2, a potential corresponding to the regulation control signal REG is transferred.

FIG. 9 shows how a data cache (storage sections DS2 to DS4) is changed in accordance with the threshold voltage Vth by programming of the logically lower page data.

(Programming of the Logically Upper Page Data)

Then, the logically upper page data is programmed.

As shown in FIG. 5A, the distribution of the memory cell threshold voltage Vth is in the "11" state (erase state) or an "L0" state as a result of programming of the logically lower page data. Subsequent programming of the logically upper page data divides the distribution of the threshold voltage Vth into four parts depending on the value ("1" or "0") of the write data (logically upper page data).

By way of example, a brief description will be given of how a memory cell in the "11" state is programmed into a "01" state using the write data "0".

For programming into the "01" state, when the write potential is transferred to the word line, the potential corresponding to one of the two program stages, the $1^{ST}$ and $2^{ND}$ passes, is transferred to the bit line, as in the case of programming of the logically lower page "0". For a memory cell having a threshold voltage lower than "Verify 01 Low Level" shown in FIG. 4, that is, a memory cell on which the $1^{ST}$ pass is to be executed, the potential across the bit line is made low (ground potential Vss). This allows high electric fields to be applied to the tunnel oxide film in the memory cell to inject electrons into the floating gate electrode to raise the threshold voltage Vth. For a memory cell having a threshold voltage Vth between "Verify 01 Low Level" and "Verify 01 Level" shown in FIG. 4, that is, a memory cell on which the $2^{ND}$ pass is to be executed, the potential across the bit line is set to a value larger than that set for the 1ST pass. This results in a smaller rise in threshold voltage Vth than during the $1^{ST}$ pass. This has been described in connection with programming of the logically lower page data. The bit line is provided with a higher voltage during the 2ND pass in the present example than during programming of the logically lower page data. This voltage is, for example, at least 0.5V and lower than Vdd. A narrower threshold distribution is thus obtained during the 2ND pass in the present example than during programming of the logically lower page data.

As in the case of programming of the logically lower page data, the data circuit controls the potential transferred to the bit line during programming of the logically lower page data, for example, during "01" programming.

During programming of the logically upper page data, the logically lower page data is read and stored in the data storage section DS3 before a write operation is performed. In the present specification, this is called internal data loading. The logically upper data to be written is stored in the data storage section DS4 (external data loading). After these operations, data cache setting is executed. Examples of these operations are shown in FIGS. 10A to 10D and 11A to 11D and their description is omitted.

"1" or "0" is stored in the data storage section DS3 depending on verification of "Verify 01 Level"; for passage, "1" is stored, and for failure, "0" is stored.

"1" or "0" is stored in the data storage section DS3 depending on verification of "Verify L0 Low Level"; for passage, "1" is stored, and for failure, "0" is stored.

As in the case of programming of the logically lower data, if the data "1" is stored in DS3, the potential Vdd is transferred. Similarly, if the data "0" is stored in both DS3 and DS2, Vss is transferred. If the data "0" is stored in DS3, whereas the data "1" is stored in DS2, a potential corresponding to the regulation control signal REG is transferred.

FIGS. 12A to 12D show the respective states of the data storage sections DS2 to DS4 in accordance with the threshold voltage Vth during programming of the logically upper page data.

With conventional programming using the pass write, the potential transferred to the bit line to which the $2^{ND}$ pass target cell is connected has a value determined by a control signal controlling the potential transfer circuit 15, for example, the regulation signal REG.

In the present example, the potential transferred to the bit line to which the $2^{ND}$ pass target cell is connected varies between programming of the logically lower page data and programming of the logically upper page data. This makes it possible to, for example, increase the magnitude of a shift in the threshold voltage Vth during the $2^{ND}$ pass for programming of the logically lower page data, while reducing the magnitude of a shift in the threshold voltage Vth during the $2^{ND}$ pass for programming of the logically upper page data. Thus, during programming of the logically lower page data, a write operation can be performed quickly. During subsequent programming of the logically upper page data, the breadth of distribution of the write threshold voltage can be reduced.

Figure 13:
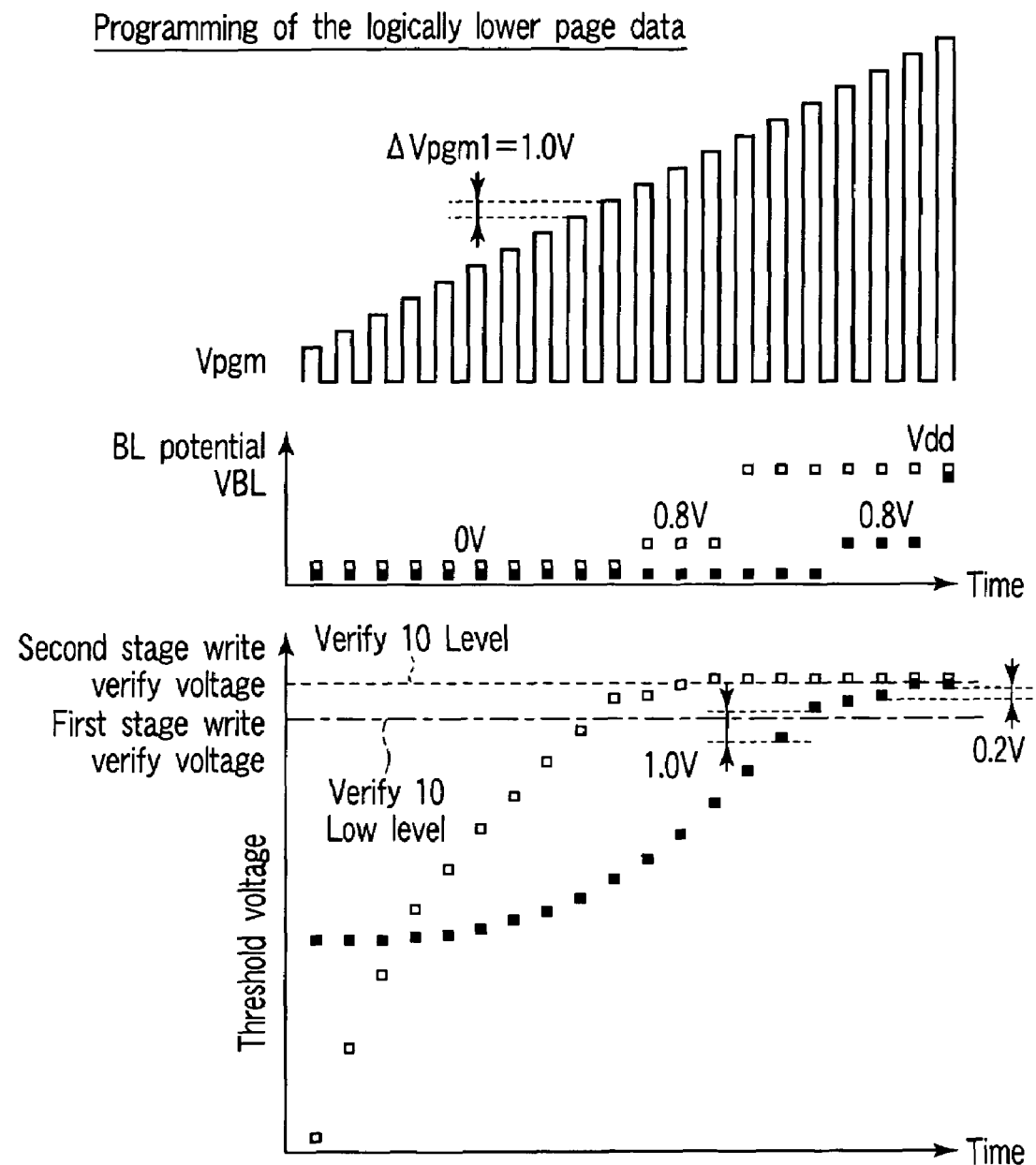
FIG. 13 is a diagram showing an example of a variation in threshold voltage during programming of logically lower page data in the semiconductor integrated circuit device in accordance with the first embodiment of the present invention.
Figure 14:
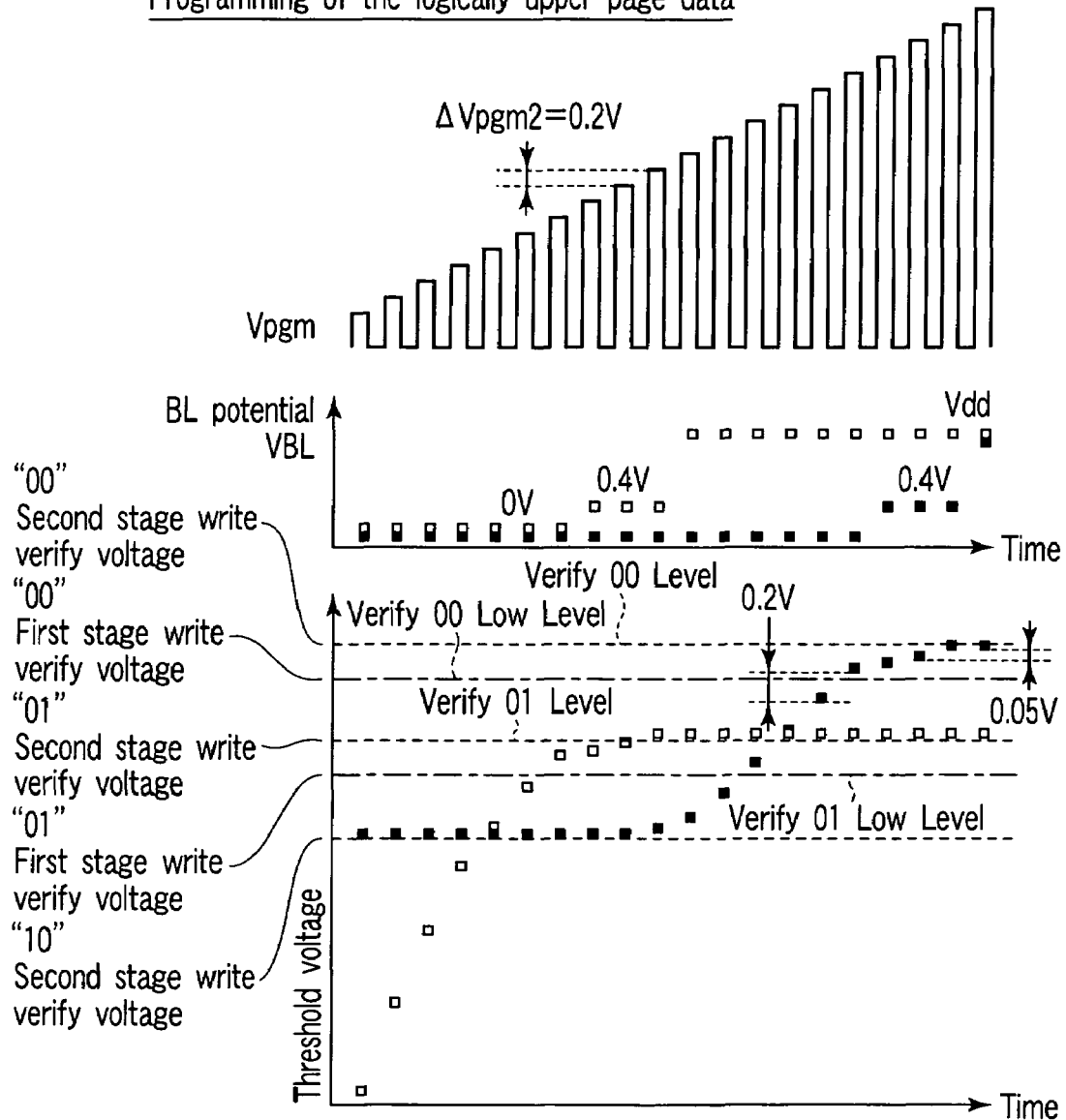
FIG. 14 is a diagram showing an example of a variation in threshold voltage during programming of logically lower page data in the semiconductor integrated circuit device in accordance with the first embodiment of the present invention.

FIG. 13 shows an example of how the threshold is varied by programming of the logically lower page data in the semiconductor integrated circuit device in accordance with the present embodiment. FIG. 14 shows an example of how the threshold is varied by programming of the logically upper page data in the semiconductor integrated circuit device in accordance with the present embodiment.

FIGS. 13 and 14 correspond to the variation in threshold voltage shown in FIGS. 5A and 5B which is re-plotted for each write pulse.

Description will be given of the variation in threshold shown in FIGS. 13 and 14.

First, data is written into the logically lower page as shown in FIG. 13.

Each white square in FIG. 13 shows a threshold for a memory cell to which data is easily written and a write control voltage (bit line voltage) supplied to this memory cell. Each black square in FIG. 13 shows a threshold for a memory cell to which data is not easily written and a write control voltage (bit line voltage) supplied to this memory cell. These two memory cells belong to the same page and store the respective column data. In an initial state, data has been erased from both memory cells, for which the threshold corresponds to a negative voltage.

A write voltage Vpgm provided to the word line is divided into a plurality of pulses. The voltage increases by, for example, 1.0V for each pulse. The amount of increase ΔVpgm1 in write voltage Vpgm per pulse is thus 1.0V.

The write control voltage (bit line voltage) remains zero until the threshold for the memory cell reaches "Verify 10 Low Level" ($1^{ST}$ pass).

If the threshold for the memory cell reaches "Verify 10 Low Level" and then "verify 10 Level", the write control voltage (bit line voltage) remains 0.8V.

When the write control voltage (bit line voltage) is zero, the amount of shift in the threshold per pulse near "Verify 10 Low Level" is, for example, about 1.0V. When the write control voltage (bit line voltage) is 0.8V, the amount of shift in the threshold per pulse near "Verify 10 Low Level" decreases to about 0.2V. This results in a small breadth of distribution ($2^{ND}$ pass).

When the threshold for the memory cell reaches "Verify 10 Level", the write control voltage (bit line voltage) becomes Vdd. When the write control voltage (bit line voltage) becomes Vdd, write operations are suppressed to prevent the threshold for the memory cell from being shifted.

FIG. 14 shows an example of how the threshold voltage is varied by programming of the logically upper page data in the semiconductor integrated circuit device in accordance with the present embodiment. FIG. 14 corresponds to the variation in threshold voltage shown in FIG. 5B which is re-plotted for each write pulse.

Subsequently, data is written into the logically upper page as shown in FIG. 14.

As in the case of FIG. 13, each white square in FIG. 14 shows a threshold for a memory cell to which data is easily written and a write control voltage (bit line voltage) supplied to this memory cell. Each black square in FIG. 14 shows a threshold for a memory cell to which data is not easily written and a write control voltage (bit line voltage) supplied to this memory cell. These two memory cells belong to the same page and store the respective column data.

The amount of increase ΔVpgm2 in write voltage Vpgm provided to the word line is 0.2V.

The write control voltage (bit line voltage) remains zero until the threshold for the memory cell reaches "Verify 01 Low Level" or "Verify 00 Low Level ($1^{ST}$ pass).

Until the threshold for the memory cell reaches "Verify 01 Low Level" or "Verify 00 Low Level" and then "Verify 01 Level" or "Verify 00 Level", the write control voltage (bit line voltage) remains 0.4V, which is lower than the write control voltage for programming of the logically lower page data.

When the write control voltage (bit line voltage) is zero, the amount of shift in the threshold per pulse near "Verify 10 Low Level" is, for example, about 0.2V. When the write control voltage (bit line voltage) is 0.4V, the amount of shift in the threshold per pulse near "Verify 10 Low Level" decreases to about 0.05V. This results in a smaller breadth of distribution ($2^{ND}$ pass).

When the threshold for the memory cell reaches "Verify 01 Level" or "Verify 00 Level", the write control voltage (bit line voltage) becomes Vdd. When the write control voltage (bit line voltage) becomes Vdd, write operations are suppressed to prevent the threshold for the memory cell from being shifted.

In the present example, a method for changing the potential transferred to the bit line varies the value of the regulation signal REG between programming of the logically lower page data and programming of the logically upper page data.

Figure 15:
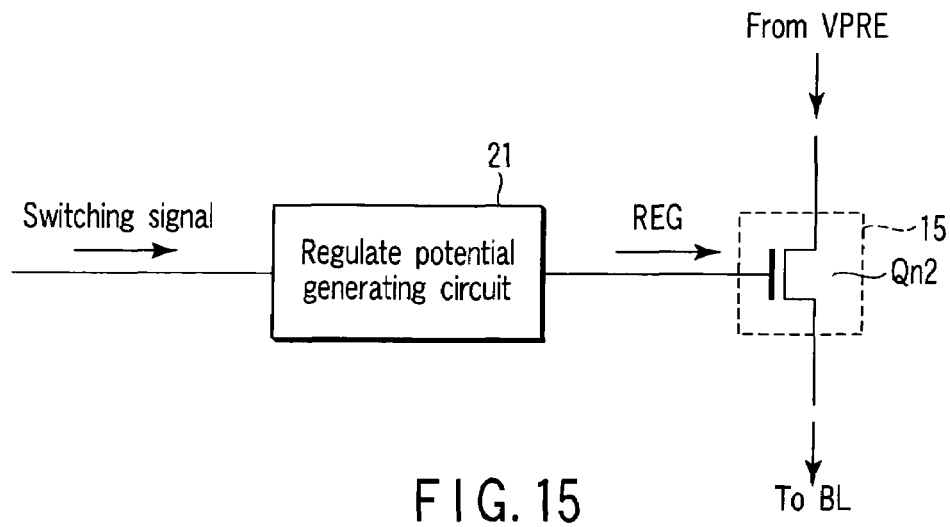
FIG. 15 is a circuit diagram showing an example of a regulated potential generating circuit provided in the semiconductor integrated circuit device in accordance with the first embodiment of the present invention.

FIG. 15 is a circuit diagram showing an example of a regulate potential generating circuit provided in the semiconductor integrated circuit device in accordance with the first embodiment of the present invention.

As shown in FIG. 15, the regulate potential generating circuit 21 outputs the regulation signal REG, provided to the potential transfer circuit 15. The potential of the regulation signal REG is changed in response to a switching signal. The switching signal may be a signal showing a program order, for example, a signal indicating whether the logically lower or upper page data is to be written. A signal can also be used which is generated on the basis of the above signal. An example of the signal indicating whether the logically lower or upper page data is to be written is a program address in program data. An example of a program address of this kind is an address indicating whether the program data is for the logically upper or lower page, the address being generated inside the chip.

Thus, the semiconductor integrated circuit device in accordance with the first embodiment varies the potential transferred to the bit line to which the 2ND pass target cell is connected, between programming of the logically lower page data and programming of the logically upper page data.

This makes it possible to provide a semiconductor integrated circuit device having an electrically rewritable nonvolatile semiconductor storage device which can reduce the breadth of distribution of the write threshold voltage while maintaining high operation speeds.

The first embodiment also changes the transferred voltage by changing the potential of the regulation signal REG. This enables the transferred potential to be changed without the need for a new circuit. This in turn gives the advantage of being able to change the transferred voltage without uselessly increasing the circuit area. This advantage can also be obtained by embodiments described later.

Second Embodiment

A second embodiment is a semiconductor integrated circuit device that changes the potential transferred to the bit line depending on whether the bit line has an even or odd number.

The nonvolatile semiconductor storage device storing data in accordance with the threshold voltage should reduce the magnitude of a shift in the write threshold voltage for subsequently written data. This is also why the first embodiment of the present specification sets the magnitude of a shift in the threshold voltage Vth during the $2^{ND}$ pass at a smaller value for programming of the logically upper page data than for programming of the logically lower page data.

Some nonvolatile semiconductor storage devices, for example, NAND type flash memories divide the bit lines into two groups each consisting of even- or odd-numbered bit lines; the groups write and read data independently of each other. For example, the device shown in FIG. 2 of the present specification operates in this manner.

A device of this kind can determine whether to write data first to memory cells connected to the even-numbered bit lines or to those connected to the odd-numbered bit lines. In short, a data write operation involves a program order. The program order requires the potential transferred to the bit line to be changed, for subsequently written data, so as to reduce the magnitude of a shift in the write threshold voltage. For example, it is assumed that data is written first to memory cells connected to the even-numbered bit lines and then to those connected to the odd-numbered bit lines. In this case, when data is written to the memory cells connected to the odd-numbered bit lines, for example, the magnitude of a shift in the threshold voltage Vth during the $2^{ND}$ pass is reduced. To achieve this, the potential transferred to the bit line is changed.

The potential transferred to the bit line in accordance with the second embodiment is changed by increasing or reducing the potential of the regulate signal as in the case of the first embodiment. The potential of the regulate signal is changed using the switching signal as in the case of the first embodiment. The switching signal may be a signal indicating a program order, for example, a signal indicating whether to write data to the even- or odd-numbered bit lines. Of course, a signal generated on the basis of the above signal can also be used. An example of the signal indicating whether to write data to the even- or odd-numbered bit lines is a program address in program data. An example of the program address of this kind is an address indicating whether to write data to the even- or odd-numbered bit lines.

Thus, the semiconductor integrated circuit device in accordance with the second embodiment changes, for example, the potential transferred to the bit line to which the $2^{ND}$ pass target cell is connected, between programming of the even-numbered bit lines and programming of the odd-numbered bit lines.

Thus, as in the case of the first embodiment, it is possible to provide a semiconductor integrated circuit device having an electrically rewritable nonvolatile semiconductor storage device that can reduce the breadth of distribution of the write threshold voltage while maintaining high operation speeds.

Third Embodiment

A third embodiment is an example of a semiconductor integrated circuit device into which the first and second embodiments are combined.

Description has been given, in the second embodiment, of the nonvolatile semiconductor storage device such as a NAND type flash memory which writes and reads data to and from the even- and odd-numbered bit lines independently. This nonvolatile semiconductor storage device can be used not only to store two values but also to store more values.

For example, it is assumed that data is written first to the memory cells connected to the even-numbered bit lines and then to those connected to the odd-numbered bit lines. It is further assumed that four values are stored as an example of multivalue storage. Then, the program order is as follows:
1. Even-numbered pages, logically lower page data
2. Odd-numbered pages, logically lower page data
3. Even-numbered pages, logically upper page data
4. Odd-numbered pages, logically upper page data With this program order, the magnitude of a shift in the write threshold voltage should be minimized in programming the logically upper page data of the odd-numbered pages.

Accordingly, the potential transferred to the bit line is changed so as to minimize the magnitude of a shift in the write threshold voltage, for example, in programming the logically upper page data of the odd-numbered pages.

This change may be effected by using a combination of the changing manners described in the first and second embodiments.

The third embodiment can be varied as described below.

(1) The potential transferred to the bit line is changed so as to minimize the magnitude of a shift in the write threshold voltage in programming the logically upper page data of the even-numbered pages and the logically upper page data of the odd-numbered pages.

This change may be effected by using, as the switching signal shown in FIG. 13, a signal indicating a program order, for example, a signal indicating whether to write data to the logically lower or upper page data. This signal is used to control the potential of the regulation signal REG.

(2) The potential transferred to the bit line is changed so as to sequentially reduce the magnitude of a shift in the write threshold voltage in the following order:
1. Even-numbered pages, logically lower page data
2. Odd-numbered pages, logically lower page data
3. Even-numbered pages, logically upper page data
4. Odd-numbered pages, logically upper page data This change may be effected by using, for example, both the signal indicating whether to write data to the even- or odd-numbered bit lines and the signal indicating whether to write the logically lower or upper page data. These signals are used to control the potential of the regulation signal REG.

The third embodiment described above can produce effects similar to those of the first and second embodiments.

Fourth Embodiment

A fourth embodiment is a semiconductor integrated circuit device that changes the potential transferred to the bit line on the basis of the write scheme.

Some nonvolatile semiconductor storage devices, for example, NAND type flash memories use MQPW as a scheme of writing an "L0" program shown in FIG. 5A and QPW as a scheme of writing a "01" program shown in FIG. 5B. MQPW performs one write operation for the $2^{ND}$ pass. Thus, for example, MQPW should perform control such that the magnitude of a shift in the write threshold voltage is smaller than in the case of QPW. Thus, for example, a signal specifying MQPW or QPW as a write scheme is used to change the potential transferred to the bit line. The change may be effected by increasing or reducing the potential of the regulation signal REG as in the case of the first, second, and third embodiments.

The signal specifying the writing scheme, for example, the signal specifying MQPW or QPW is generated in accordance with the program order in the program data. For example, the "L0" program involves generation of a signal specifying MQPW. For example, the "01" program involves generation of a signal specifying QPW. These signals are input to the regulate potential generating circuit 21, shown in FIG. 15. The regulate potential generating circuit 21 changes the potential in accordance with the signals specifying MQPW and QPW.

The fourth embodiment described above can produce effects similar to those of the first, second, and third embodiments.

Fifth Embodiment

Some nonvolatile semiconductor storage devices, for example, NAND type flash memories use a scheme of stepping up the potential provided to a selected word line during a write operation, for each write pulse. The amount by which the potential is stepped up is called a step up potential $\Delta V_{pgm}$.

Figure 16A:
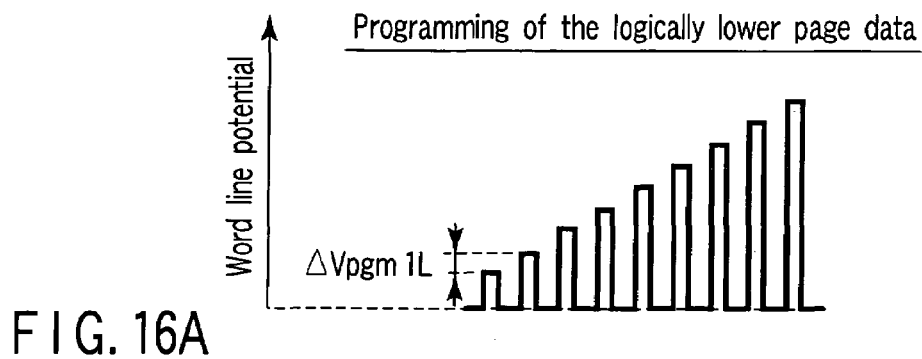
FIGS. 16A and 16B are diagrams showing an example of the step-up potential across a word line.
Figure 16B:
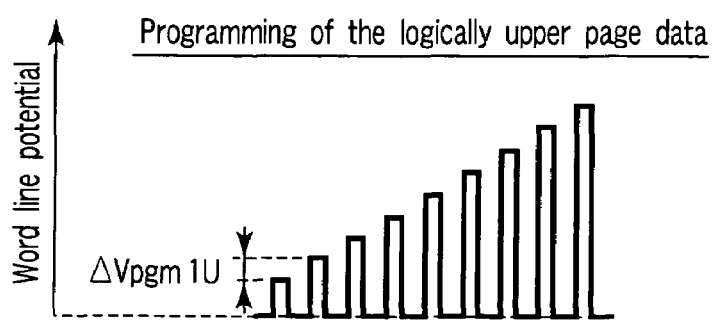

In multivalue storage, for example, four-value storage, a potential $\Delta V_{pgm1L}$ for programming of the logically lower page data is the same as a potential $\Delta V_{pgm1U}$ for programming of the logically upper page data. This is a general scheme. An example of the scheme is shown in FIGS. 16A and 16B.

To set the magnitude of a shift in the write threshold voltage at a smaller value for programming of the logically upper page data than for programming of the logically lower page data, this scheme changes the potential transferred to the bit line, for example, as described in the first embodiment. In this case, the potential transferred to the bit line is set at a larger value for programming of the logically upper page data than for programming of the logically lower page data.

Figure 17A:
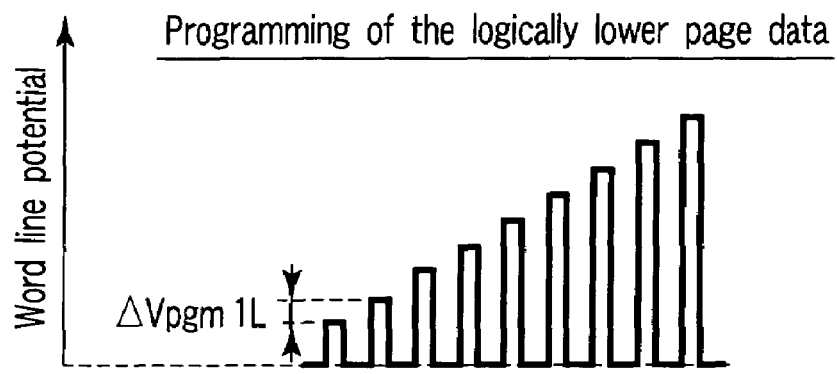
FIGS. 17A and 17B are diagrams showing another example of the step-up potential across the word line.
Figure 17B:
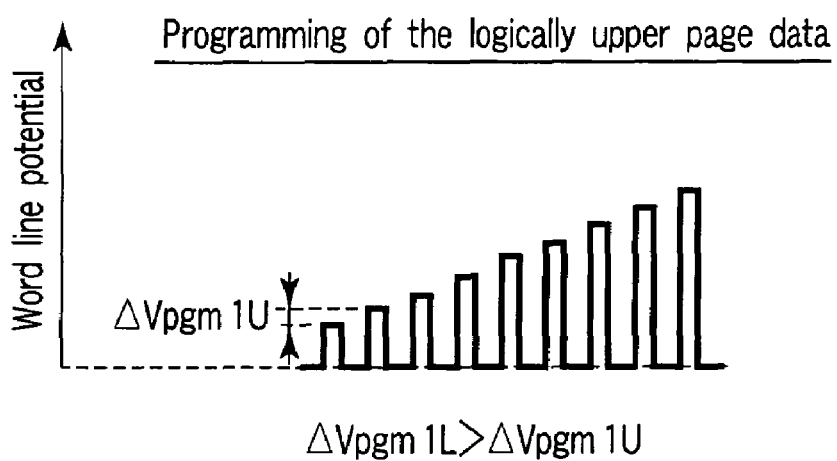

Another scheme sets the potential $\Delta V_{pgm1U}$ for programming of the logically upper page data lower than the potential $\Delta V_{pgm1L}$ for programming of the logically lower page data as shown in FIGS. 17A and 17B.

This scheme does not necessarily set the potential transferred to the bit line at a larger value for programming of the logically upper page data than for programming of the logically lower page data. On the contrary, the scheme may set the potential transferred to the bit line at a smaller value for programming of the logically upper page data than for programming of the logically lower page data.

The magnitude of a shift in the write threshold voltage can be set at a smaller value for programming of the logically upper page data than for programming of the logically lower page data, by setting the potential transferred to the bit line at either a larger or, on the contrary, smaller value for programming of the logically upper page data than for programming of the logically lower page data. Either operation may be appropriately used.

Sixth Embodiment

The first embodiment shows, as a method for changing the potential transferred to the bit line, the example in which the value of the regulation signal REG is varied between programming of the logically lower page data and programming of the logically upper page data.

The first embodiment also shows, as an example of a regulation potential generating circuit generating a regulation signal REG, the regulate potential generating circuit 21 that changes the potential of the regulation signal REG in accordance with the switching signal.

The present example shows another example of the regulate potential generating circuit 21 that changes the potential of the regulation signal REG in accordance with the switching signal.

Figure 18:
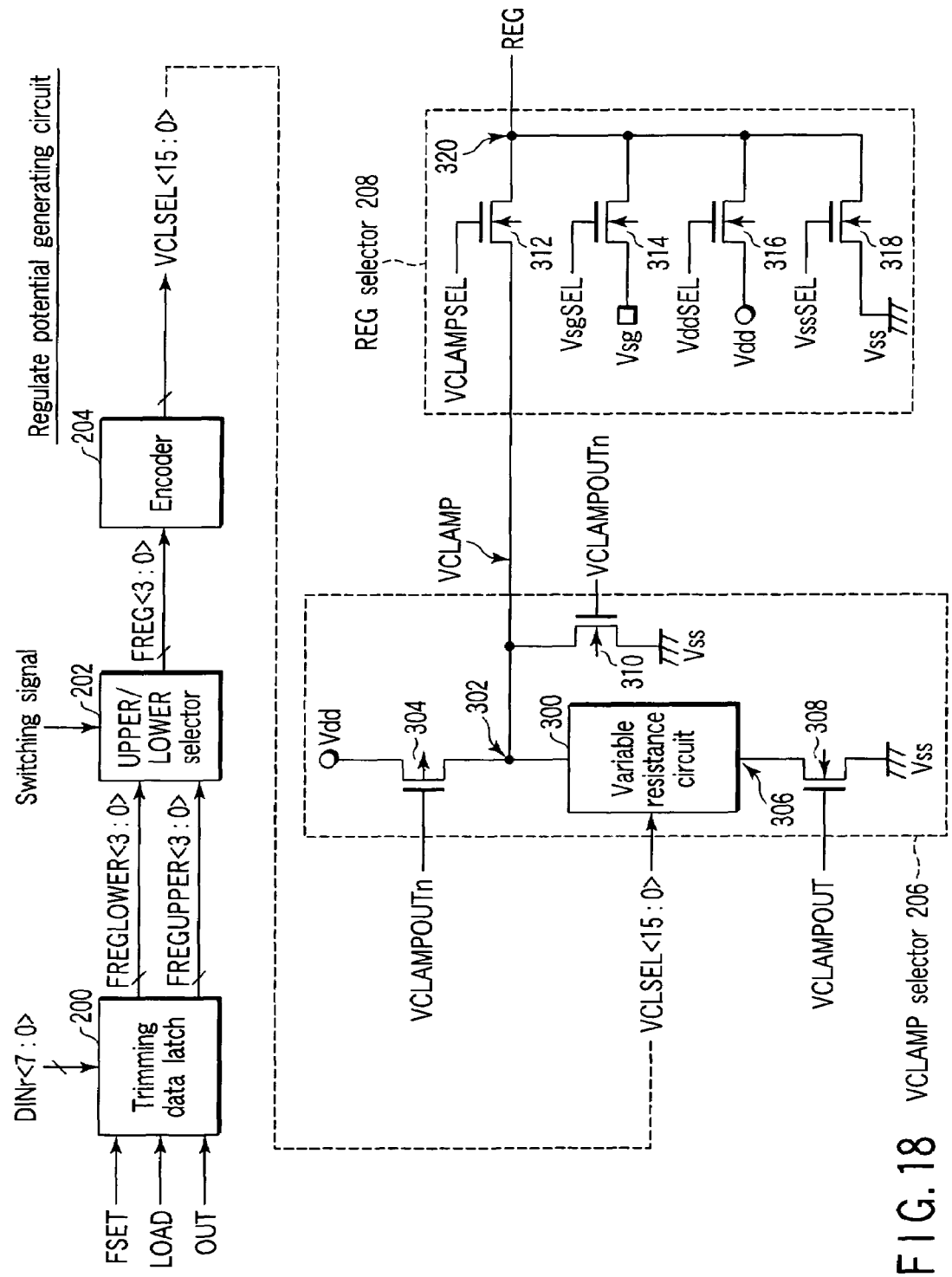
FIG. 18 is a circuit diagram showing an example of a regulated potential generating circuit in accordance with a sixth embodiment of the present invention.

FIG. 18 is a block diagram showing an example of a regulate potential generating circuit in accordance with a sixth embodiment of the present invention.

As shown in FIG. 18, the regulate potential generating circuit includes a trimming data latch 200, an UPPER/LOWER selector 202, an encoder 204, a VCLAMP selector 206, and a REG selector 208.

The trimming data latch 200 is a circuit that latches trimming data, for example, during a boot sequence executed at the time of power on. The trimming data is set for each semiconductor integrated circuit chip on the basis of its characteristics. For example, the value of the write voltage Vpgm or the like is set for each chip in accordance with the trimming data. In the present example, the value of the regulate signal is set for each chip in accordance with the trimming data. The trimming data is stored in the semiconductor integrated circuit chip using ROM in the chip or some areas of the memory cell array in which nonvolatile memory cells are integrated.

When the chip is powered on, the trimming data is read from the ROM or memory cell array. When both signals LOAD and FSET are enabled, the trimming data is latched in a trimming data latch via a data bus DINr. The data bus DINr in the present example has a bit length of 8 bits (DINr [7:0]). FIG. 19 shows an example of the trimming data latch 200.

As shown FIG. 19, the trimming data latch 200 in accordance with this example includes a logically lower trimming data latch circuit 400 and a logically upper trimming data latch circuit 402. The logically lower data latch circuit 400 latches trimming data FREGLOWER that determines the value of the signal REG used for programming of the logically lower page data. Similarly, the logically upper data latch circuit 402 latches trimming data FREGUPPER that determines the value of the signal REG used for programming of the logically upper page data. In the present example, the trimming data FREGLOWER has a bit length of 4 bits (FREGLOWER [3:0]). The trimming data FREGUPPER also has a bit length of 4 bits (FREGUPPER [3:0]). Accordingly, the logically lower trimming data latch circuit 400 is composed of four sets (400-0 to 400-3). The logically upper trimming data latch circuit 402 is composed of four sets (402-0 to 402-3). The trimming data FREGLOWER [3:0] and the trimming data FREGUPPER [3:0] are input to the UPPER/LOWER selector 202.

The UPPER/LOWER selector 202 selects either the trimming data FREGLOWER [3:0] or FREGUPPER [3:0] in accordance with the switching signal. The switching signal may be the one described in the first embodiment. FIG. 20 shows an example of the UPPER/LOWER selector 202.

As shown in FIG. 20, the UPPER/LOWER selector 202 in accordance with this example generates a signal LOWER specifying logically lower programming or a signal UPPER specifying logically upper programming depending on whether the switching signal is passed through, for example, either an odd- or even-numbered inverter circuit. The signal LOWER is input to a first input of a LOWER AND gate circuit 408. The signal UPPER is input to a first input of an UPPER AND gate circuit 410. The trimming data FREGLOWER is input to a second input of the LOWER AND gate circuit 408. The trimming data signal FREGUPPER is input to a second input of the UPPER AND gate circuit 410. Outputs from the LOWER AND gate circuit 408 and UPPER AND gate circuit 410 are input to an OR gate circuit 412.

When the signal LOWER is high, while the signal UPPER is low, the output from the UPPER AND gate circuit 410 is high regardless of the value of the trimming data FREGUPPER. On the other hand, the output from the LOWER AND gate circuit 408 is high or low (LOWER is enabled) depending on the value of the trimming data FREGLOWER. Consequently, the value of an output FREG from the OR gate circuit 412 depends on the value of the trimming data FREGLOWER.

On contrary, when the signal LOWER is low, while the signal UPPER is high, UPPER is enabled and the value of the output FREG from the OR gate circuit 412 depends on the value of the trimming data FREGUPPER. In the present example, the output FREG has a bit length of 4 bits (FREG [3:0]). Accordingly, the apparatus has four combinatory circuits (408-0 to 408-3, 410-0 to 410-3, 412-0 to 412-3) each composed of the AND gate circuits 408 and 410 and OR gate circuit 412. The output FREG [3:0] is input to the encoder 204.

The encoder 204 encodes the 4-bit output FREG [3:0] to generate 16 VCLAMP selection signals VCLSEL [15:0]. FIG. 21 shows an example of the encoder 204.

As shown in FIG. 21, the encoder 204 in accordance with this example includes 16 AND gate circuits 414-0 to 414-15 each of which receives one of 16 combinations of the 4-bit output FREG [3:0]. Each of the AND gate circuits 414-0 to 414-15 outputs a selection signal VCLSEL [15:0]. The selection signal VCLSEL [15:0] is input to a VCLAMP selector 206.

The VCLAMP selector 206 includes a P channel type MOS transistor 304, a variable resistance circuit 300, and an N channel type MOS transistor 308 which are connected together in series between the power supply potential Vdd and the in-circuit ground potential Vss. The selection signal VCLSEL [15:0] is input to the variable resistance circuit 300. An example of the variable resistance circuit 300 is shown in FIG. 22.

Figure 22:
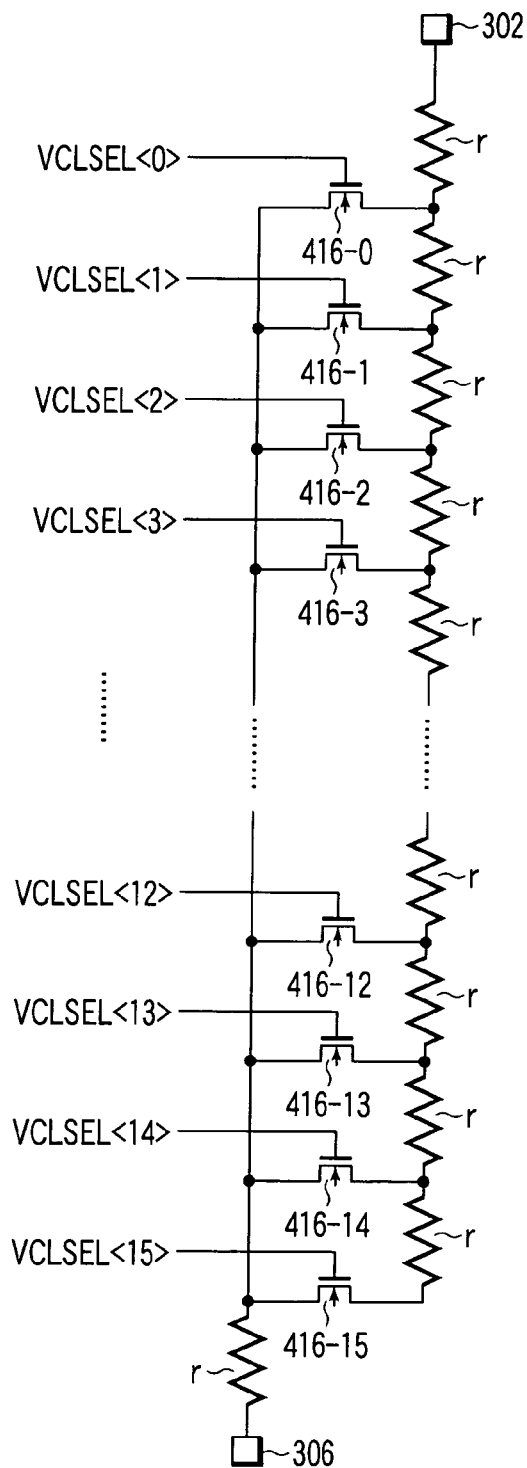
FIG. 22 is a circuit diagram showing an example of a variable resistance circuit.

As shown in FIG. 22, the variable resistance circuit 300 in accordance with the present invention is of a resistance division type. The variable resistance circuit of the resistance division type includes a column of resistors r connected together in series with the terminal resistor r connected to an output node 302. N channel type MOS transistors 416-0 to 416-15 are connected together in parallel between the resistors r in the resistor column and a ground-side node 306 so that each N channel type MOS transistor is connected between the ground-side node 306 and corresponding junction between the resistors r. The selection signal VCLSEL [15:0] is supplied to the gate of each of the N channel type MOS transistors 416-0 to 416-15. One of the transistors 416-0 to 416-15 becomes conductive in accordance with the selection signal VCLSEL [15:0]. Making one of the MOS transistors conductive allows the output node 302 and the ground-side node 306 to be connected together so as to have one of the 16 resistance values. The potential VCLAMP at the output node 302 has one of the 16 values in accordance with the selection signal VCLSEL [15:0].

As shown in FIG. 18, the P channel type MOS transistor 304 is connected in series between the output node 302 and power supply potential Vdd in the VCLAMP selector 206. Similarly, the N channel type MOS transistor 308 is connected in series between the ground-side node 306 and the in-circuit ground potential Vss. A signal VCLAMPOUTn is provided to the gate of the P channel type MOS transistor 304. A signal VCLAMPOUT is provided to the gate of the N channel type MOS transistor 308. The signals VCLAMPOUTn and VCLAMPOUT determine when the VCLAMP selector 206 output the potential VCLAMP. The VCLAMP is output by the VCLAMP selector 206 when the signal CLAMPOUTn goes low, whereas the signal VCLAMP goes high. On contrary, the potential VCLAMP is not output when the signal CLAMPOUTn is high, whereas the signal VCLAMP is low. In the present example, an N channel type MOS transistor 310 is connected in series between the output node 302 and the in-circuit ground potential Vss. The signal VCLAMPOUTn is provided to the gate of the N channel type MOS transistor 310. The N channel type MOS transistor 310 is conductive and fixes the potential at the output node 302 to the in-circuit ground potential Vss while the signal VCLAMPOUTn is high, that is, while the potential VCLAMP is not output. The potential VCLAMP is input to the REG selector 208.

As shown in FIG. 18, the REG selector 208 selects one of the potentials VCLAMP, a potential Vsg, the power supply potential Vdd, and the in-circuit ground potential Vss in accordance with selection signals VCLAMPSEL, VsgSEL, VddSEL, and VssSEL. The selected potential is output as the regulation signal REG, which is then provided to, for example, a gate of a N channel type MOS transistor Qn2 shown in FIG. 15. The selection signals VCLAMSEL, VsgSEL, VddSEL, and VssSEL are provided to gates of N channel type MOS transistors 312, 314, 316, and 318 provided in the REG selector 208. The transistor 312 is connected in series between, in the present example, a supply node for the potential VCLAMP (in the present example, the output node 302 of the VCLAMP selector 206) and an output node 320 of the REG selector 208. Similarly, the transistors 314, 316, and 318 are connected in series between a supply node for the potential Vsg and the output node 320, between a supply node for the potential Vdd and the output node 320, and between a supply node for the potential Vss and the output node 320, respectively.

The sixth embodiment can switch the potential of the regulation signal REG between programming of the logically lower page data and programming of the logically upper page data in accordance with the switching signal.

The sixth embodiment further determines the potential of the regulation signal REG in accordance with the trimming data latched in the trimming data latch 200. This makes it possible to set, for each chip, both the values of the regulation signals REG used for programming of the logically lower page data and for programming of the logically upper page data. A variation in the breadth of distribution of the write threshold value can thus be corrected for each chip on the basis of its characteristics. This makes it possible to provide a semiconductor integrated circuit device having a nonvolatile semiconductor storage device, for example, a NAND type flash memory in which the distribution breadth varies insignificantly among the chips and is very uniform among the products.

The above embodiments can provide a semiconductor integrated circuit device having an electrically rewritable nonvolatile semiconductor storage device that can reduce the breadth of distribution of the write threshold voltage while maintaining high operation speeds.

The present invention has been described in conjunction with the embodiments. However, the present invention is not limited to the above embodiments. In implementation, many variations may be made to the embodiments without departing from the spirit of the present invention.

The embodiments may be independently carried out but may also be appropriately combined together.

Each of the embodiments includes various levels of inventions, which can be extracted by appropriately combining a plurality of components disclosed in the embodiments.

The embodiments have been described on the basis of the examples in which the present invention is applied to the NAND type flash memory. However, the present invention is not limited to the NAND type flash memory but is applicable to the flash memories other than the NAND type, such as an AND type and a NOR type. Semiconductor integrated circuit devices incorporating such flash memories, for example, processors and system LSIs belong to the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
nonvolatile semiconductor memory cells, each memory cell being able to store at least a first bit and a second bit based on threshold voltage state;
bit lines each connected to one end of the nonvolatile semiconductor memory cells;
a data circuit connected to the bit lines to temporarily store program data for the nonvolatile semiconductor memory cells;
the data circuit supplying, during a data program operation, a first program potential, a second program potential, or a third program potential to each bit line;
the first program potential, which is lower than the second program potential, being supplied until the threshold voltage of the nonvolatile memory cell surpasses a first-pass level less than a second-pass level;
the second program potential, which is lower than the third program potential, being supplied when the threshold voltage of the nonvolatile memory cell is between the first-pass level and the second-pass level;
the third program potential being supplied after the threshold voltage of the nonvolatile memory cell surpasses the second-pass level; and
the second program potential for the first bit being different from the second program potential for the second bit.

2. The device according to claim 1, wherein the nonvolatile semiconductor memory cell includes a NAND type flash memory cell unit.

3. A semiconductor integrated circuit device comprising:
nonvolatile semiconductor memory cells;
bit lines each connected to one end of the nonvolatile semiconductor memory cells, the memory cells being programmed with at least two different program methods;
a data circuit connected to the bit lines to temporarily store program data for the nonvolatile semiconductor memory cells;
the data circuit supplying, during a data program operation, a first program potential, a second program potential, or a third program potential to each bit line;
the first program potential, which is lower than the second program potential, being supplied until a threshold voltage of the nonvolatile memory cell surpasses a first-pass level less than a second-pass level;
the second program potential, which is lower than the third program potential, being supplied when the threshold voltage of the nonvolatile memory cell is between the first-pass level and the second-pass level;
the third program potential being supplied after the threshold voltage of the nonvolatile memory cell surpasses the second-pass level; and
the second program potentials for the two program methods being different.

4. The device according to claim 3, wherein the two program methods are either quick-pass-write or modified-quick-pass-write.

5. The device according to claim 3, wherein the nonvolatile semiconductor memory cell includes a NAND type flash memory cell unit.

6. A semiconductor integrated circuit device comprising:
nonvolatile semiconductor memory cells;
bit lines each connected to one end of the nonvolatile semiconductor memory cells, the bit lines having a first group and a second group;
a data circuit connected to the bit lines to temporarily store program data for the nonvolatile semiconductor memory cells, the data circuit supplying, during a data program operation, a first program potential, a second program potential, or a third program potential to each bit line;
the first program potential, which is lower than the second program potential, being supplied until a threshold voltage of the nonvolatile memory cell surpasses a first-pass level less than a second-pass level;
the second program potential, which is lower than the third program potential, being supplied when the threshold voltage of the nonvolatile memory cell is between the first-pass level and the second-pass level;
the third program potential being supplied after the threshold voltage of the nonvolatile memory cell surpasses the second-pass level; and
the nonvolatile memory cells connected to the first group of the bit lines and the nonvolatile memory cells connected to the second group of the bit lines being not programmed simultaneously and the second program potential for the first group and the second program potential for the second group being different.

7. The device according to claim 6, wherein the first group of the bit lines and the second group of the bit lines are either even bit lines or odd bit lines.

8. The device according to claim 6, wherein the nonvolatile semiconductor memory cell includes a NAND type flash memory cell unit.

* * * * *